United States Patent
Murden et al.

(10) Patent No.: US 7,382,305 B1
(45) Date of Patent: Jun. 3, 2008

(54) REFERENCE GENERATORS FOR ENHANCED SIGNAL CONVERTER ACCURACY

(75) Inventors: Franklin M. Murden, Roan Mountain, TN (US); Bac Binh Luu, Lemon Grove, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/711,239

(22) Filed: Feb. 26, 2007

(51) Int. Cl.
*H03M 1/00* (2006.01)

(52) U.S. Cl. .................. 341/155; 327/539; 341/135
(58) Field of Classification Search ............... 341/135, 341/136, 155, 144, 118, 163, 134; 327/538, 327/539
See application file for complete search history.

(56) References Cited

U.S. PATENT DOCUMENTS

| | | | |
|---|---|---|---|
| 5,471,208 A | 11/1995 | Sauer | 341/120 |
| 5,821,807 A | 10/1998 | Brooks | 327/541 |
| 5,856,748 A * | 1/1999 | Seo et al. | 327/53 |
| 6,259,392 B1 | 7/2001 | Choi et al. | 341/150 |
| 6,396,334 B1 | 5/2002 | Aram | 327/541 |
| 6,400,214 B1 | 6/2002 | Aram | 327/541 |
| 6,417,725 B1 | 7/2002 | Aram et al. | 327/541 |
| 6,452,152 B1 | 9/2002 | Yang | 250/208.1 |
| 6,459,326 B2 * | 10/2002 | Descombes | 327/513 |
| 6,803,795 B2 * | 10/2004 | Nakajima et al. | 327/67 |
| 6,963,300 B1 | 11/2005 | Lee | 341/172 |
| 6,967,611 B2 | 11/2005 | Atriss et al. | 341/172 |
| 7,005,839 B2 * | 2/2006 | Wada | 323/316 |
| 7,320,484 B2 * | 1/2008 | Wuthrich | 285/184 |

OTHER PUBLICATIONS

Razavi, Behzad, "Design of Analog CMOS Integrated Circuits", McGraw Hill, New York, New York, 2001, pp. 393-398.

* cited by examiner

*Primary Examiner*—Peguy JeanPierre
(74) *Attorney, Agent, or Firm*—Koppel, Patrick, Heybl & Dawson

(57) ABSTRACT

Reference generator embodiments are provided with low output impedances to enhance reference stability in the presence of varying loads. The generators are structured to provide these impedances in an efficient manner (i.e., with low supply currents) and also to provide both sink and source currents to better handle large transient current demands. The generators also include cascode structures that facilitate operation with low values of a supply voltage and that provide a low sensitivity to variations in this supply voltage. The embodiments are especially suited for use in signal converter systems.

20 Claims, 4 Drawing Sheets

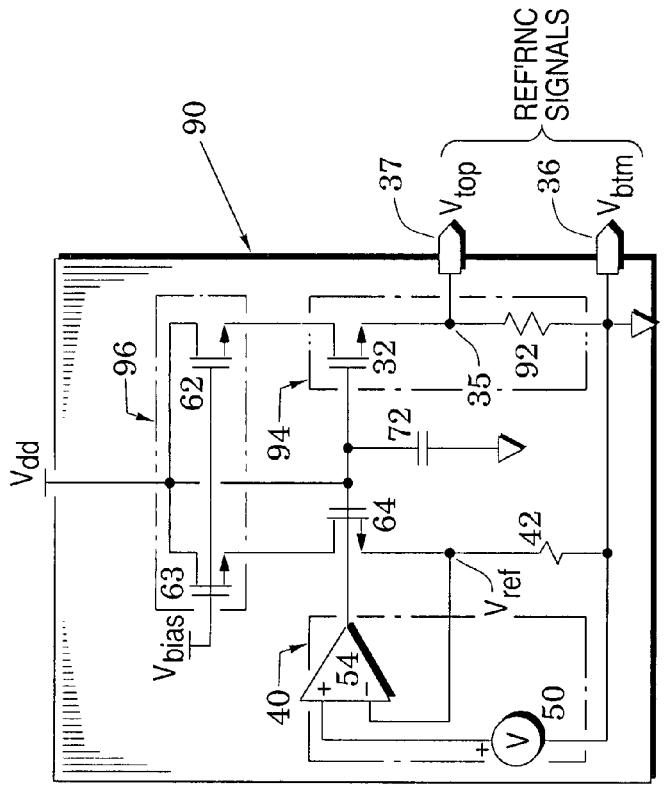
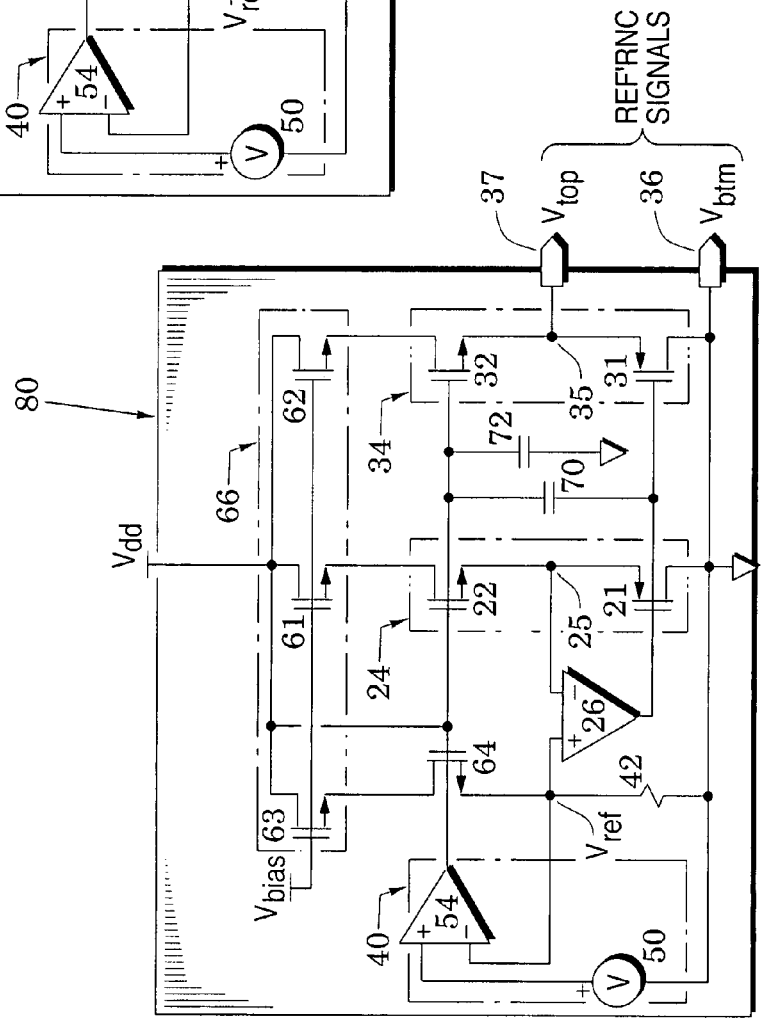
FIG. 2A
FIG. 2B

REFERENCE GENERATORS FOR ENHANCED SIGNAL CONVERTER ACCURACY

BACKGROUND OF THE INVENTION

1. Field of the Invention

The present invention relates generally to generators of referenced signals and applications thereof.

2. Description of the Related Art

The accuracy of many electronic systems is degraded if reference generators cannot efficiently supply reference signals that are stable under various operational conditions which include rapidly varying load impedances, large transient current demands, and varying supply voltages.

An exemplary reference generator application is for use in a pipelined analog-to-digital converter system. Such systems are configured with successive converter stages which each convert an analog input signal to respective digital bits of a final digital code that corresponds to the analog input signal. Except for a final converter stage, each converter stage also passes a residue signal to a succeeding stage for further conversion processing.

The residue signal is the difference between the analog signal presented to the stage and the analog equivalent of this stage's respective digital bits. Errors in generation of the residue signal cannot be corrected and, accordingly, they contribute directly to errors in the corresponding digital code.

The residue signal is often generated in switched-capacitor versions of a multiplying digital-to-analog converter (MDAC). In these MDACs, capacitors are switched in a first portion of each sample period to receive a charge from the residue signal of the preceding converter stage and switched in a second portion of each sample period to transfer this charge to an output capacitor. These charging and transferring processes are generally accomplished with the aid of reference signals from a reference generator and the accuracy of these processes is dependent upon the ability of the generator to maintain the accuracy of its reference signals in the presence of various operational conditions.

BRIEF SUMMARY OF THE INVENTION

The present invention is generally directed to structures of differential amplifiers that enhance amplifier transient performance. The drawings and the following description provide an enabling disclosure and the appended claims particularly point out and distinctly claim disclosed subject matter and equivalents thereof.

BRIEF DESCRIPTION OF THE DRAWINGS

FIGS. 2A and 2B are schematics of other generator embodiments;

DETAILED DESCRIPTION OF THE INVENTION

Figure 1:
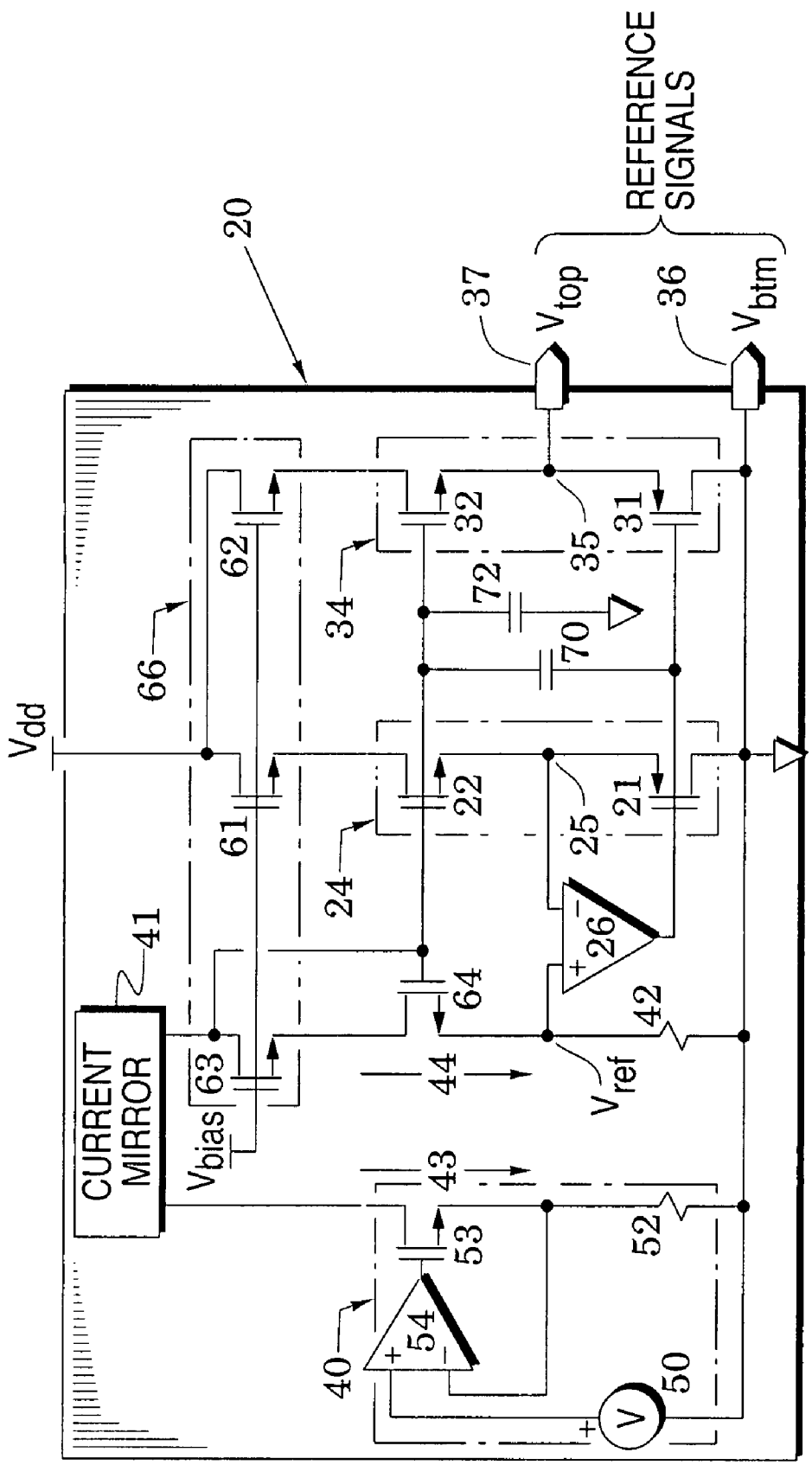
FIG. 1 is a schematic of a reference generator embodiment of the present invention.

FIG. 1 illustrates a reference generator embodiment 20 that generates reference signals and is structured to provide these signals with low output impedances so as to enhance the stability of the signals in the presence of varying loads. The structure of the generator provides these impedances in an efficient manner (i.e., with low supply currents) and also provides both sink and source currents to better handle large transient current demands. The generator is also structured to operate with low values of a supply voltage and to have a low sensitivity to variations in this supply voltage.

In particular, the generator 20 of FIG. 1 includes first and second transistors 21 and 22 that are arranged to form a first complementary stage 24 with first coupled current terminals 25. The generator also includes a differential amplifier 26 that is arranged to drive a control terminal of one of the first and second transistors in response to the difference between a reference voltage $V_{ref}$ and a voltage at the first coupled current terminals 25.

Finally, third and fourth transistors 31 and 32 are arranged to form a second complementary stage 34 that is coupled through control terminals to the first complementary stage 24 and has second coupled current terminals 35 that provide a top reference signal $V_{top}$ at a reference port 37. The bottom of the second complementary stage 34 also provides a bottom reference signal $V_{btm}$ at a second reference port 36.

In a generator embodiment, the reference voltage $V_{ref}$ is originated by a current generator 40, a current mirror 41 and an impedance element in the form of a resistor 42. The current generator generates a reference current 43 which is mirrored by the current mirror 41 to a mirror current 44 that generates the reference voltage $V_{ref}$ as it passes through the resistor 42.

In an embodiment, the current generator 40 is formed with a voltage source 50, a second impedance element in the form of a resistor 52, a current transistor 53 and a differential amplifier 54. The current transistor is connected to drive the reference current 43 through the resistor 52 and the differential amplifier 54 is arranged to drive a control terminal of the current transistor 53 in response to the voltage source 50 and a voltage that is generated by flow of the current 43 through the resistor 52.

Preferably, the generator 20 also includes first and second cascode transistors 61 and 62 that are respectively coupled in cascode arrangements with the first and second complementary stages 24 and 34 (in particular, in cascode arrangements with the second and fourth transistors 22 and 32).

The mirror current 44 is preferably conducted through a bias transistor 64 that is coupled through control terminals to the second and fourth transistors 22 and 32 and is coupled to pass the mirror current 44 to the resistor 42. In the embodiment of FIG. 1, a third cascode transistor 63 is arranged in cascode with the bias transistor 64 to receive the mirror current 44. The third cascode transistor has its control terminal coupled to control terminals of the first and second cascode transistors 61 and 62 and further coupled to receive a bias voltage $V_{bias}$.

Preferably, the control terminal of the bias transistor 64 is coupled to the upper current terminal of the third cascode transistor 63. The voltage across the third cascode transistor 63 thus subtracts from the voltage at the control terminal of the bias transistor 64 and the difference is applied to the upper current terminal of the bias transistor 64.

With the mirror current 44 established, the bias voltage $V_{bias}$ can then be selected to establish desired drain-tosource voltages across the first cascode and second transistors 61 and 22 and across the second cascode and fourth transistors 62 and 32. Essentially, transistors 61, 62 and 63 act as a cascode stage 66 for the bias transistor 64 and second and fourth transistors 22 and 32.

For example, these drain-to-source voltages can be controlled to be spaced above the transistors' saturation voltage ($V_{dsat}$) by selected margins. These margins increase the gains of these transistors which also enhances their power supply rejection ratio (PSRR) so that the reference signal $V_{top}$ is substantially insensitive to changes in the supply voltage $V_{dd}$. This margin establishment is especially important for reference generators realized in fine line complementary metal-oxide-semiconductor structures (CMOS).

In operation of the current generator 40, the high gain of the differential amplifier 54 (with current conversion of the current transistor 53) causes the voltage across its input terminals to be substantially zero so that the reference current 43 generates a voltage across the resistor 52 that is substantially the voltage of the voltage source 50. In a generator embodiment in which resistors 42 and 52 are equally sized and the current mirror 41 is a 1:1 mirror, the reference voltage $V_{ref}$ at one input terminal of the differential amplifier 26 will also be substantially the voltage of the voltage source 50.

To enhance the performance of systems based on the reference generator 20, the voltage reference 50 should deliver a highly stable voltage. Accordingly, it can be any one of various generator structures (e.g., bandgap generators) that are substantially immune to (or have a well-defined dependence to) system variations (e.g., temperature and power supply variations) and to system spurious signals (e.g., noise signals).

In operation of the reference generator 20, the differential amplifier 26 drives the control terminal of the first transistor 21 to thereby alter the voltage at the first coupled current terminals 25 of the first complementary stage 24. The high gain of the differential amplifier 26 causes the voltage at the first coupled current terminals to be substantially the reference voltage $V_{ref}$. Thus, coupled current terminals of the second complementary stage 34 provide a first one ($V_{top}$) of the reference signals and a different current terminal of one of the third and fourth transistors provides a second one ($V_{btm}$) of the reference signals.

In the generator 20, all transistors of the same polarity (e.g., all NMOS field-effect devices or all PMOS field-effect devices) are preferably configured to operate with the same current density. Accordingly, the voltage $V_{top}$ at the second coupled current terminals 35 of the second complementary stage 34 will also be controlled to substantially be the reference voltage $V_{ref}$. If the resistors 42 and 52 are equally sized and the current mirror 41 is a 1:1 mirror, the voltage $V_{top}$ will substantially be the voltage of the voltage reference 50.

In an important feature of the generator 20, the reference port 36 provides an output impedance of substantially zero because it is referenced to ground and, in addition, the transistors of the complementary first and second stages 24 and 34 operate in a common drain arrangement. Accordingly, the output impedance at the reference port 37 is substantially $1/g_{m31}$ in parallel with $1/g_{m32}$ wherein the third and fourth transistors 31 and 32 have transconductances $g_{m31}$ and $g_{m32}$ and it is noted that these transconductances vary directly with current through the second complementary stage 34. The complementary second stage 34 can thus efficiently provide a low output impedance. This advantage is further discussed below with reference to the generator embodiment of FIG. 2B.

In another important feature of the generator 20, the complementary nature of the output stage 34 provides both source and sink currents to a reference load which enhances its ability to maintain the reference signals when in the presence of large transient load currents.

In yet another feature, the isolation provided by the cascode stage 66 significantly reduces the generator's sensitivity to changes in the variations of the supply voltage $V_{dd}$. In the arrangement of FIG. 1, the voltage provided to the first and second complementary stages 22 and 32 remains essentially unchanged with variations the supply voltage $V_{dd}$ in because of the isolation of the cascode stage 66. Accordingly, the PSRR of the generator 20 is substantially enhanced.

In FIG. 1, a capacitor 70 is preferably coupled across the control terminals of the second complementary stage 34 and another capacitor 72 couples the control terminal of the fourth transistor 32 to ground to thereby limit the bandwidth of noise in the reference signal $V_{top}$ at the reference port 37. Although capacitor 70 could be moved, in another generator embodiment, to couple the control terminal of the third transistor 32 to ground, it is preferably arranged as in FIG. 1 to reduce transient currents that might initiate generator startup problems.

In exemplary embodiments of the reference generator 20, the size (width of the control terminal) of the transistors of the second complementary stage 34 can be increased to favorably reduce the output impedance at the output ports 36 and 37. At the same time, the size of other transistors (e.g., those of the first complementary stage 24) can be reduced to further enhance the generator's efficiency (i.e., reduce its current drain) so long as they are configured to have the same current density as the transistors of the second complementary stage.

To form other generator embodiments, it is noted that the schematic of FIG. 1 can be essentially inverted so that the generator operates with an negative supply voltage supply and provides a ground-referenced reference signal and a negative reference signal.

FIG. 2A illustrates another reference generator embodiment 80 that has similarities to the reference generator 20 of FIG. 1 with like elements indicated by like reference numbers. In contrast, however, the generator 80 removes the current mirror 41, impedance element 52, and current transistor 53 of FIG. 1 and respectively moves the output terminal and an input terminal of the differential amplifier 54 to a control terminal and a lower current terminal of the bias transistor 64. It is noted that "reference" is abbreviated to "ref'rnc" at the reference ports 37 and 36 to conserve drawing space.

In operation of the reference generator 80, the gain of the operational amplifier 54 is applied to the control terminal of the bias transistor 64 which adjusts current through the resistor 42 until the reference voltage $V_{ref}$ is substantially the voltage of the voltage reference 50 (i.e., until the differential input voltage of the differential amplifier 54 is substantially zero). Although the current mirror 41 of the generator 20 of FIG. 1 provides additional isolation of the voltage source 50, the generator 80 provides the advantage of a simpler reference structure.

FIG. 2B illustrates another reference generator embodiment 90 that has similarities to the reference generator 80 of FIG. 2A with like elements indicated by like reference numbers. In contrast, however, the generator 90 replaces the third transistor 31 with a resistor 92 and removes the differential amplifier 26, the first complimentary stage 24, the capacitor 70 and the first cascode transistor 61. The second complementary stage 34 and the cascode stage 66 of the generator 80 of FIG. 2A are thereby altered to an output stage 94 and a cascode stage 96 in the generator 90 of FIG. 2B.

In the reference generator 90, the differential amplifier 54 is arranged to drive current terminals of the bias transistor 64 and the fourth transistor 32 in response to the difference between the reference voltage and a voltage at a current terminal of the bias transistor. Reference signals $V_{top}$) and $V_{btm}$ are thus provided at first and second ends of the resistor 92.

The source follower 32 and associated resistor 92 of the output stage 94 are arranged to provide a reference signal $V_{btm}$ whose output impedance is substantially zero because it is referenced to ground. They also provide a reference signal $V_{top}$ whose output impedance is substantially $1/g_{m32}$ wherein it is assumed that the resistance of the resistor 92 is comparatively large to reduce the quiescent current drain.

If the output current is set to be the same as in the generator 20 of FIG. 1, then this output impedance of $1/g_{m32}$ is approximately twice the output impedance of the generator 20 which was shown above to be $1/g_{m31}$ in parallel with $1/g_{m32}$. In order to match the output impedance of the generator 20, the current in the output stage 94 of the generator 90 would have to be doubled. Thus, although the reference generator 90 has the advantage of a simpler reference structure, the generator 20 is provides low output impedances in a more efficient manner (i.e., with reduced current drain).

As shown above, reference generator embodiments of the invention efficiently provide low output impedances and sink and source currents and can operate with low sensitivity to reduced values of a supply voltage. They are thus useful in a variety of electronic systems such as the pipelined analog-to-digital converter embodiment 100 of FIG. 3.

The converter 100 includes a pipelined arrangement of converter stages 102 that process samples of an analog input signal (at an input port 103) which are provided by a clocked signal sampler 104. During an initial clock cycle, an initial converter stage is configured (e.g., as a flash converter) to quantize an input sample to an initial number of digital bits.

The initial converter stage (shown as stage 1) then passes the initial bits to a time aligner/corrector 106 and also forms a residue signal $S_{res}$ which is passed to a succeeding converter stage. During a succeeding clock cycle, the succeeding converter stage quantizes this residue signal to provide additional digital bits. It also forms and passes on a corresponding residue signal.

This process continues to a final converter stage which provides final digital bits. Because the converter stages provide their respective bits on successive clock cycles, an aligner/corrector 106 is configured to selectively delay different ones of the bits so as to bring them into time alignment to generate a digital code that corresponds to the initial analog input signal.

The converter stages are generally configured to provide conversion redundancy (e.g., in the form of redundant digital bits) which is utilized in the aligner/corrector 106 to reduce conversion errors. Because each converter stage only has to provide limited quantization, the clock speed and corresponding signal throughput of pipelined ADCs can be quite high.

As shown by extension lines 108, an exemplary $i_{th}$ converter stage may include a flash converter 109 and a multiplying digital-to-analog converter (MDAC) 110 which has a DAC 112, a summer 114 and an amplifier 115. The converter 109 provides the respective digital bits $D_i$ of the $i_{th}$ converter stage and the DAC 112 converts this quantization to a corresponding analog signal which is subtracted from an input residue signal in the summer 114 to form, a difference signal.

This difference signal is gained up in the amplifier 115 so that the signal window provided to the succeeding converter stage is substantially that presented to the present it, stage. This gained up signal is the output residue signal $S_{res}$ that is passed to the succeeding stage for further conversion. A sample/hold circuit 116 is preferably provided to hold the input residue signal while the MDAC processes it into the succeeding residue signal $S_{res}$.

Figure 3:
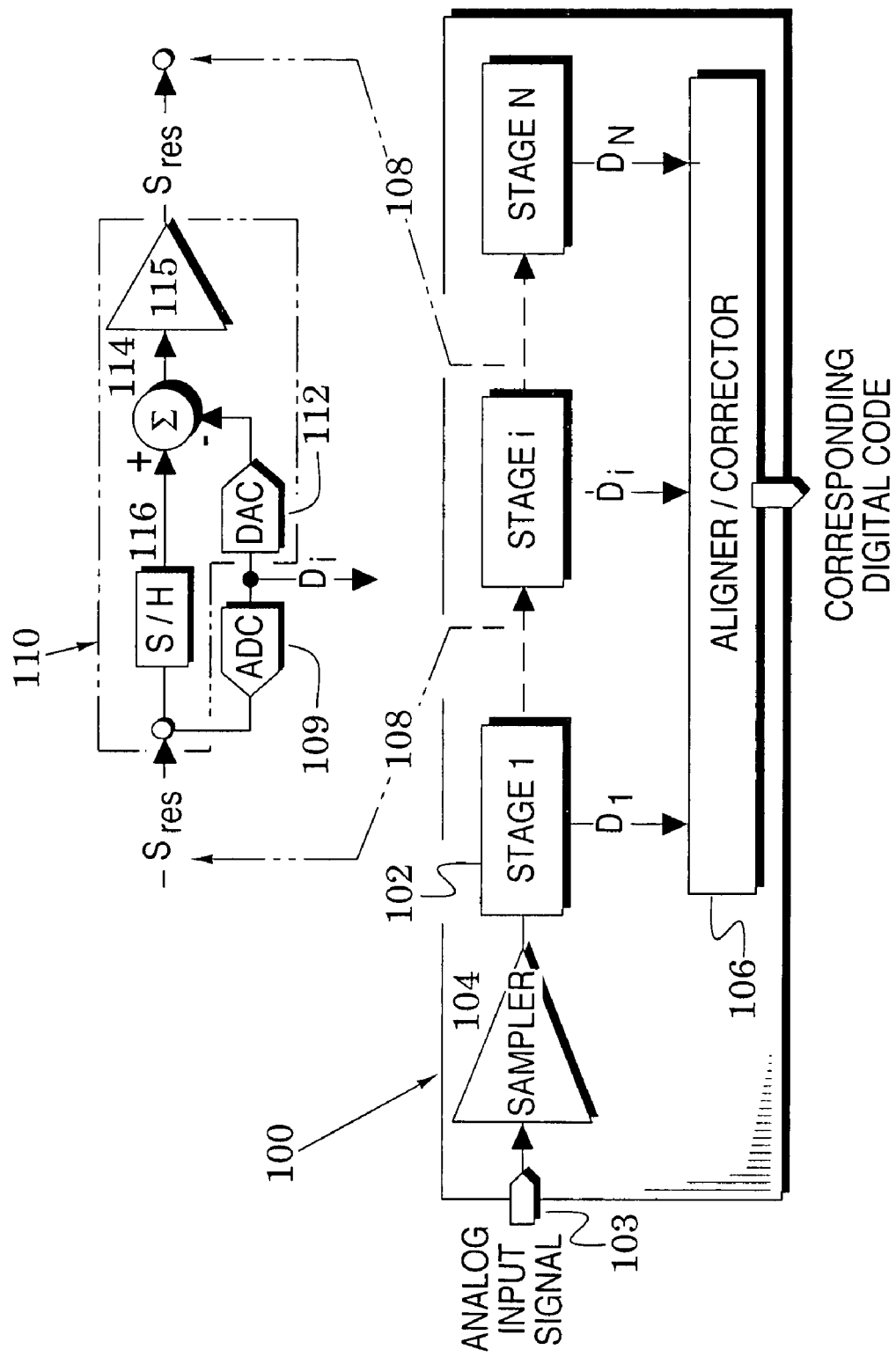
FIG. 3 is a diagram of an analog-to-digital converter system which includes an MDAC embodiment.
Figure 4A:
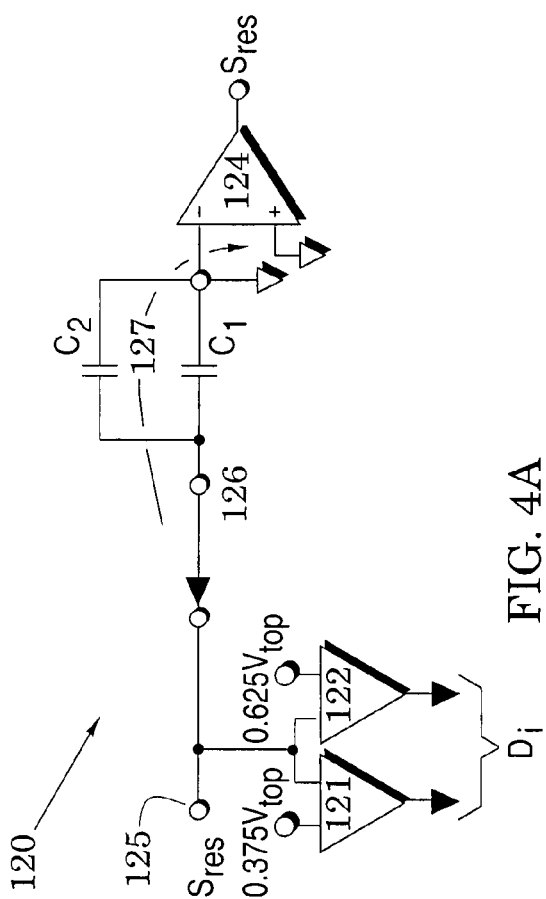
FIG. 4 is a schematic of an MDAC embodiment which includes a reference generator that may be realized with generator embodiments of the present invention.
Figure 4B:
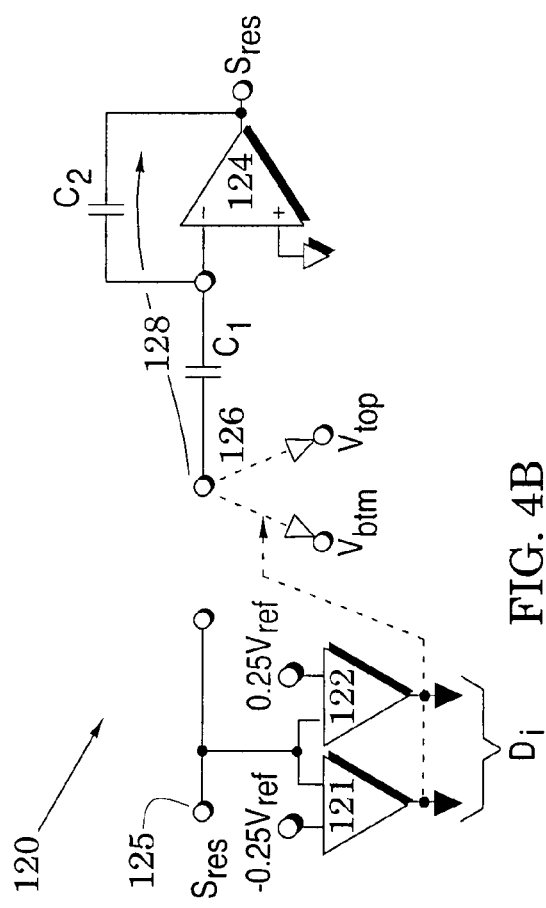

FIGS. 4A and 4B illustrate operational modes of a switched-capacitor structure 120 which may be used to form the MDAC 110 of FIG. 3. For exemplary purposes, the MDAC 120 is shown in a form suitable for use when its respective converter stage 102 of FIG. 3 is a 1.5 bit converter stage. A 1.5 bit stage is an example of a stage that provides redundant bits which, as described above, may be used to improve conversion accuracy in the aligner/corrector (106 in FIG. 3).

The MDAC 120 includes comparators 121 and 122 which form the ADC 109 of FIG. 3. An embodiment of the MDAC 110 of FIG. 3 is provided by an amplifier 124 and associated switched capacitors C1 and C2. The comparators 101 and 102 have decision points set at $-0.25\ V_{ref}$ and $+0.25\ V_{ref}$ wherein reference voltages $-V_{ref}$ and $+V_{ref}$ define the edges of the analog input window of the respective converter stage.

FIG. 4A shows a sample mode of operation that occurs in a first portion of each clock cycle. During this sample mode, the comparators 121 and 122 compare the input residue signal $S_{res}$ to the references and provide the digital bits $D_i$ of this $i^{th}$ converter stage. In this sample mode, a switch 126 is in a position which couples capacitors C1 and C2 to the input port 125 so that a charging current 127 can charge them to the residue signal $S_{res}$.

FIG. 4B shows a transfer (or gain) mode of operation that occurs during a final portion of the clock cycle that began in FIG. 4A. The switch 126 is now in a position to select an appropriate one of reference signals $V_{btm}$ and $V_{top}$. The appropriate one is a function of the current digital bits $D_i$ as indicated by the broken line 130 which positions the switch 126. Other switches (not shown) of the switched-capacitor structure swing the capacitor C2 about the amplifier 124 so that a transfer current 128 transfers stored charge from capacitor C1 to capacitor C2. The transferred charge alters the amplifier's output to an output residue signal $S_{res}$ that is appropriate for further conversion processing by succeeding ones of the converter stages of FIG. 3.

Any errors that are made in generation of the value of the residue signal $S_{res}$ contribute directly to error in the corresponding digital code that is provided by the aligner/corrector 106 of FIG. 3. Although other portions of the converter structure (e.g., the redundancy of the 1.5 bit converter of FIGS. 4A and 4B) can be used to correct conversion errors and enhance converter accuracy, nothing can be done to correct for errors in the output residue signal $S_{res}$—these errors contribute directly to error in the corresponding digital code.

Because it is important to enhance the accuracy of the output residue signal $S_{res}$, the magnitudes of the reference signals $V_{btm}$ and $V_{top}$ must be tightly controlled as the current 128 is provided. These currents must often be provided at an exceedingly high rate. For example, a pipelined converter may have several converter stages and process data at several megasamples per second so that the reference generator must meet this high-rate current demand from each of the converter stages. As noted above, the structures of the reference generators 20 and 80 of FIGS. 1 and 2 are particularly suited for this task.

Although generator embodiments have been illustrated with metal-oxide-semiconductor transistors, it is noted that equivalent generator embodiments can be formed with various transistor structures that have first and second current terminals responsive to corresponding control terminals.

The embodiments of the invention described herein are exemplary and numerous modifications, variations and rearrangements may achieve substantially equivalent results and are intended to be embraced in the appended claims.

We claim:

1. A reference generator that provides reference signals, comprising:
    first and second transistors arranged to form a first complementary stage with first coupled current terminals;
    a differential amplifier arranged to drive a control terminal of one of said first and second transistors in response to the difference between a reference voltage and a voltage at said first coupled current terminals; and
    third and fourth transistors arranged to form a second complementary stage that is coupled through control terminals to said first complementary stage, has second coupled current terminals which provide a first one of said reference signals, and provides a second one of said reference signals with a different current terminal of one of said third and fourth transistors.

2. The generator of claim 1, wherein said first coupled current terminals and said second coupled current terminals are sources.

3. The generator of claim 1, further including:
    a current generator that provides a reference current;
    a current mirror that mirrors said reference current to a mirror current; and
    a first impedance element that provides said reference voltage in response to said mirror current.

4. The generator of claim 3, wherein said current generator includes:
    a voltage source;
    a second impedance element;
    a current transistor connected to drive said reference current through said second impedance element; and
    a differential amplifier arranged to drive a control terminal of said source transistor in response to said voltage source and a voltage across said second impedance element.

5. The generator of claim 4, wherein said first and second impedance elements are resistors.

6. The generator of claim 1, further including a cascode stage arranged in cascode with said first and second complementary stages.

7. The generator of claim 1, further including first and second cascode transistors respectively arranged in cascode with said first and second complementary stages.

8. The generator of claim 7, further including:
    a third cascode transistor coupled through control terminals to said first and second cascode transistors and to a bias voltage; and
    a bias transistor coupled between said reference voltage and said third cascode transistor and coupled through control terminals to said second and fourth transistors.

9. The generator of claim 8, wherein a control terminal of said bias transistor is coupled to a current terminal of said first cascode transistor.

10. The generator of claim 1, further including a capacitor coupled between control terminals of said second complementary stage.

11. A reference generator that provides reference signals, comprising:
    first and second transistors having first and second current terminals;
    first and second resistors respectively coupled to said first and second current terminals; and
    a differential amplifier arranged to drive control terminals of said first and second transistors in response to the difference between a reference voltage and a voltage at said first current terminal;
    first and second reference signals thereby provided at first and second ends of said second resistor.

12. The generator of claim 11, wherein said first and second current terminals are first and second sources.

13. The generator of claim 11, further including first and second cascode transistors respectively arranged in cascode with said first and second transistors.

14. The generator of claim 13, wherein a control terminal of said first transistor is coupled to a current terminal of said first cascode transistor.

15. The generator of claim 11, further including a capacitor coupled between control terminals of said first and second transistors and a selected end of said second resistor.

16. A signal converter system that converts analog input signals to corresponding digital signals, comprising:
    a sampler that provides samples of said input signal;
    successive converter stages that provide successive digital estimates of said sample wherein at least one of said converter stages generates a corresponding residue signal;
    a reference generator that provides at least one reference signal;
    a multiplying digital-to-analog converter in at least one of said converters that is configured to generate said residue signal in response to respective ones of said digital estimates and said reference signal; and
    an aligner/corrector that provides said corresponding digital signals in response to said successive digital estimates;
    wherein said reference generator includes:
        first and second transistors arranged to form a first complementary stage with first coupled current terminals;
        a differential amplifier arranged to drive a control terminal of one of said first and second transistors in response to the difference between a reference voltage and a voltage at said first coupled current terminals; and
        third and fourth transistors arranged to form a second complementary stage that is coupled through control terminals to said first complementary stage, has second coupled current terminals which provide a first one of said reference signals, and provides a second one of said reference signals with a different current terminal of one of said third and fourth transistors.

17. The system of claim 16, further including:
    a current generator that provides a reference current;
    a current mirror that mirrors said reference current to a mirror current; and a first impedance element that provides said reference voltage in response to said mirror current.

18. The system of claim 16, wherein said current generator includes:
a voltage source;
a second impedance element;
a source transistor connected to drive said reference current through said second impedance element; and
a differential amplifier arranged to drive a control terminal of said source transistor in response to said voltage source and a voltage across said second impedance element.

19. The system of claim 16, further including:
an impedance element;
a current transistor having a current terminal coupled to said impedance element;
a voltage source; and
a differential amplifier arranged to drive a control terminal of said current transistor in response to said voltage source and a voltage across said impedance element.

20. The system of claim 16, further including first and second cascode transistors respectively arranged in cascode with said first and second complementary stages.

* * * * *